(12) United States Patent  
Hong

(10) Patent No.: US 7,115,855 B2
(45) Date of Patent: Oct. 3, 2006

(54) IMAGE SENSOR HAVING PINNED FLOATING DIFFUSION DIODE

(75) Inventor: Sungkwon C. Hong, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 259 days.

(21) Appl. No.: 10/654,938

(22) Filed: Sep. 5, 2003

(65) Prior Publication Data

US 2005/0051701 A1 Mar. 10, 2005

(51) Int. Cl.
*H01L 31/00* (2006.01)
*H01L 31/062* (2006.01)

(52) U.S. Cl. ............... 250/214.1; 250/208.1; 257/292

(58) Field of Classification Search ........... 257/292; 250/214.1, 208.1; 348/308
See application file for complete search history.

(56) References Cited

U.S. PATENT DOCUMENTS

| | | | |
|---|---|---|---|
| 5,841,159 A | 11/1998 | Lee et al. | |
| 5,880,495 A | 3/1999 | Chen et al. | |
| 5,904,493 A * | 5/1999 | Lee et al. ................. | 438/57 |
| 6,140,630 A | 10/2000 | Rhodes | |
| 6,204,524 B1 | 3/2001 | Rhodes | |
| 6,218,691 B1 * | 4/2001 | Chung et al. ............... | 257/290 |
| 6,307,195 B1 * | 10/2001 | Guidash .................. | 250/208.1 |
| 6,310,366 B1 | 10/2001 | Rhodes et al. | |
| 6,326,652 B1 | 12/2001 | Rhodes | |
| 6,333,205 B1 | 12/2001 | Rhodes | |
| 6,344,877 B1 | 2/2002 | Gowda et al. | |
| 6,376,868 B1 | 4/2002 | Rhodes | |
| 6,388,243 B1 | 5/2002 | Berezin et al. | |
| 6,921,891 B1 * | 7/2005 | Seitz .................... | 250/214 R |
| 2002/0020863 A1 | 2/2002 | Lee et al. | |

FOREIGN PATENT DOCUMENTS

JP 61111057 5/1986

OTHER PUBLICATIONS

U.S. Appl. No. 10/422,695, Rhodes, filed Apr. 22, 2003.
Translation of Preliminary Notice of Rejection of the IPO dated Aug. 29, 2005.
International Preliminary Report on Patentability, Jan. 26, 2006.

* cited by examiner

*Primary Examiner*—Thanh X. Luu
(74) *Attorney, Agent, or Firm*—Dickstein Shapiro LLP

(57) ABSTRACT

The present invention provides an image sensor having a pinned floating diffusion region in addition to a pinned photodiode. The pinned floating diffusion region increases the capacity of the sensor to store charge, increases the dynamic range of the sensor and widens intra-scene intensity variation.

41 Claims, 17 Drawing Sheets

IMAGE SENSOR HAVING PINNED FLOATING DIFFUSION DIODE

FIELD OF THE INVENTION

The invention relates generally to methods and apparatus pertaining to a pixel array of an imager. In particular, the invention relates to imagers having pixels with an improved floating diffusion region.

BACKGROUND

Typically, a digital imager array includes a focal plane array of pixel cells, each one of the cells including a photoconversion device, e.g. a photogate, photoconductor, or a photodiode. In one such imager, known as a CMOS imager, a readout circuit is connected to each pixel cell which typically includes a source follower output transistor. The photoconversion device converts photons to electrons which are typically transferred to a charge storage region, which may be a floating diffusion region, connected to the gate of the source follower output transistor. A charge transfer device (e.g., transistor) can be included for transferring charge from the photoconversion device to the floating diffusion region. In addition, such imager cells typically have a transistor for resetting the floating diffusion region to a predetermined charge level prior to charge transference. The output of the source follower transistor is gated as an output signal by a row select transistor.

Exemplary CMOS imaging circuits, processing steps thereof, and detailed descriptions of the functions of various CMOS elements of an imaging circuit are described, for example, in U.S. Pat. No. 6,140,630 to Rhodes, U.S. Pat. No. 6,376,868 to Rhodes, U.S. Pat. No. 6,310,366 to Rhodes et al., U.S. Pat. No. 6,326,652 to Rhodes, U.S. Pat. No. 6,204,524 to Rhodes, and U.S. Pat. No. 6,333,205 to Rhodes. The disclosures of each of the forgoing are hereby incorporated by reference herein in their entirety.

FIG. 1 illustrates a block diagram of an exemplary imager device 308 having a pixel array 200 with each pixel cell being constructed as described above. Pixel array 200 comprises a plurality of pixels arranged in a predetermined number of columns and rows. The pixels of each row in array 200 are all turned on at the same time by a row select line, and the pixels of each column are selectively output by respective column select lines. A plurality of row and column lines are provided for the entire array 200. The row lines are selectively activated by a row driver 210 in response to row address decoder 220. The column select lines are selectively activated by a column driver 260 in response to column address decoder 270. Thus, a row and column address is provided for each pixel. The CMOS imager is operated by the timing and control circuit 250, which controls address decoders 220, 270 for selecting the appropriate row and column lines for pixel readout. The control circuit 250 also controls the row and column driver circuitry 210, 260 such that these apply driving voltages to the drive transistors of the selected row and column lines. The pixel column signals, which typically include a pixel reset signal ($V_{rst}$) and a pixel image signal ($V_{sig}$) for selected pixels, are read by a sample and hold circuit 261 associated with the column device 260. A differential signal ($V_{rst}-V_{sig}$) is produced by differential amplifier 262 for each pixel which is digitized by analog to digital converter 275 (ADC). The analog to digital converter 275 supplies the digitized pixel signals to an image processor 280 which forms a digital image.

Pixels of conventional image sensors, such as a CMOS imager, employ a photoconversion device as shown in FIG. 2. This photoconversion device may typically include a photodiode 59 having a p-region 21 and n-region 23 in a p-substrate. The pixel also includes a transfer transistor with associated gate 25, a floating diffusion region 16, and a reset transistor with associated gate 29. Photons striking the surface of the photodiode 59 generate electrons which are collected in region 23. When the transfer gate is on, the photon-generated electrons in region 23 are transferred to the floating diffusion region 16 as a result of the potential difference existing between the photodiode 59 and floating diffusion region 16. The charges are converted to voltage signals by a source follower transistor (not shown). Prior to charge transfer, the floating diffusion region 16 is set to a predetermined low charge state by turning on the reset transistor having gate 29 which causes electrons in region 16 to flow into a voltage source connected to a source/drain 17. Regions 55 are STI insulation regions for isolating the pixels from one another.

FIG. 3 is a potential diagram for the image sensor shown in FIG. 2. The full well charge capacity of the photodiode 59 is in the shaded area under heading "PD" and is a function of a pinned potential ($V_{PIN}$) and photodiode capacitance ($C_{PD}$). When the number of electrons generated reaches the charge capacity, the photodiode is saturated and cannot respond to any further photons. Generated electrons collected in region 23 are transferred from the photodiode 59 to the floating diffusion region 16. The floating diffusion region charge storage capacity also has a saturation voltage, shown as the shaded region under the heading "FD." The bottom potential $V_{RST}$ represents a reset voltage of the floating diffusion region 16. When the transfer gate 25 is on, the barrier potential separating the photodiode 59 and floating diffusion region 16 is lowered, as represented by the dotted line in FIG. 3. As a result, electrons move from the photodiode 59 to the floating diffusion region 16.

As shown in the graph of FIG. 4, the output voltage response based on the charge transferred to region 16 is a linear function of the light intensity up to the point where the response reaches the region 16 saturation point ($V_{SAT}$). The region 16 saturation point limits the dynamic range of the pixel and the ability of the image sensor to capture intra-scene intensity variations under certain light conditions.

SUMMARY OF THE INVENTION

Embodiments of the present invention provide a pixel of an image sensor with a pinned floating diffusion region. The photodiode and pinned floating diffusion region have different pinning potentials, thus allowing output voltage to rise more slowly as light intensity generates electrons which approach the saturation level of the floating diffusion region. As light intensity rises, the charge reaches the pinning potential of the floating diffusion region and the output voltage/light intensity slope changes. The change in slope of output voltage increases dynamic range.

Additional features of the present invention will be apparent from the following detailed description and drawings which illustrate exemplary embodiments of the invention.

DETAILED DESCRIPTION OF THE INVENTION

In the following detailed description, reference is made to the accompanying drawings, which form a part hereof and show by way of illustration specific embodiments in which the invention may be practiced. These embodiments are described in sufficient detail to enable those skilled in the art to practice the invention, and it is to be understood that other embodiments may be utilized, and that structural, logical, and electrical changes may be made without departing from the spirit and scope of the present invention. The progression of processing steps described is exemplary of embodiments of the invention; however, the sequence of steps is not limited to that set forth herein and may be changed as is known in the art, with the exception of steps necessarily occurring in a certain order.

The terms "wafer" and "substrate," as used herein, are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor need not be silicon-based, but could be based on silicon-germanium, germanium, gallium arsenide or other semiconductors.

The term "pixel," as used herein, refers to a photo-element unit cell containing a photoconversion device for converting photons to an electrical signal. For purposes of illustration, a single representative pixel and its manner of formation is illustrated in the figures and description herein; however, typically fabrication of a plurality of like pixels proceeds simultaneously. In the following description, the invention is described in relation to a CMOS imager for convenience; however, the invention has wider applicability to circuits of other types of imager devices, for example the invention is also applicable to an output stage of a CCD imager. Accordingly, the following detailed description is not to be taken in a limiting sense, and the scope of the present invention is defined only by the appended claims.

Figure 7:
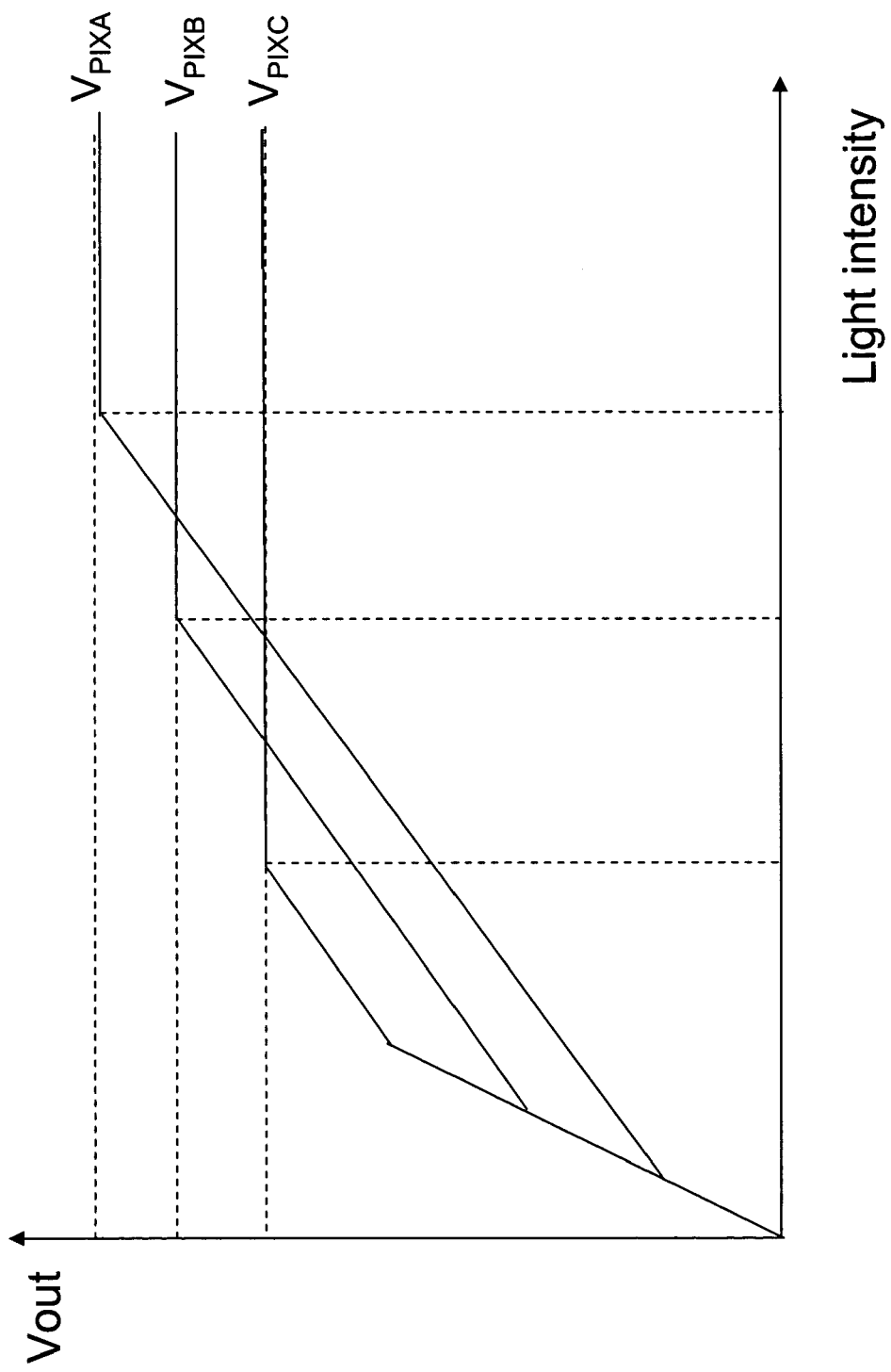
FIG. 7 is a graph showing output voltage as a function of input light signal for the pixel of FIG. 5.

A first exemplary embodiment of the invention provides a pinned diode floating diffusion region which modifies how charge is received and stored at the floating diffusion region to widen the dynamic range of an image sensor. The doping structure of the pinned diode floating diffusion region is similar to that of a pinned photodiode. However, the pinned diode floating diffusion region has a different pin potential ($V_{PIN2}$) from that of the photodiode ($V_{PIN1}$). Because $V_{PIN2}$ is a different potential than $V_{PIN1}$, the output voltage ($V_{OUT}$) rises in two linear regions of different slope for each $V_{PIX}$ as shown in FIG. 7 for example, in response to photodiode charge before a saturation point is reached.

Figure 5:
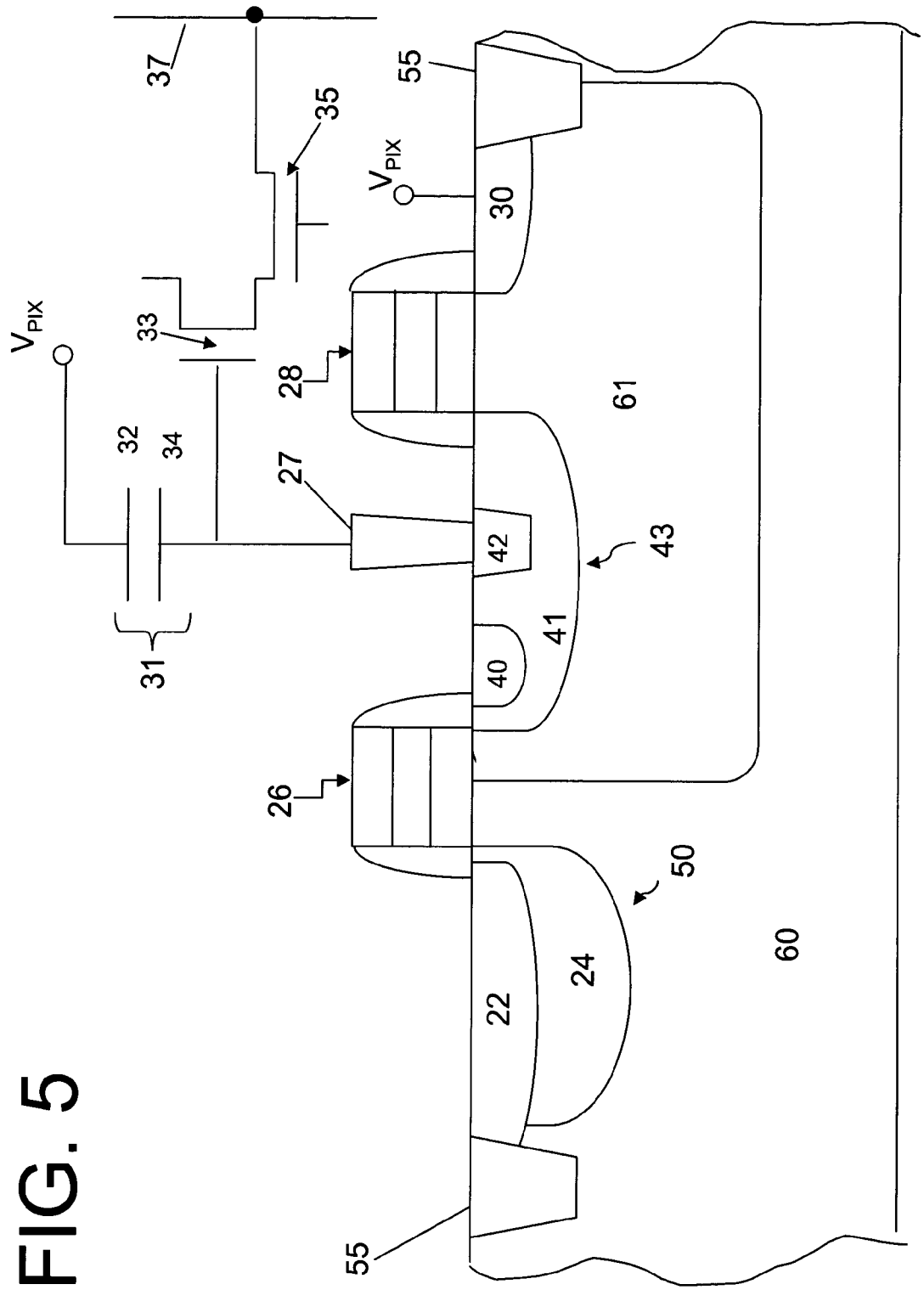
FIG. 5 is a cross-sectional view of a portion of a pixel of an image sensor according to an embodiment of the invention.

FIG. 5 illustrates a pixel sensor cell constructed in accordance with the first embodiment. A photoconversion device 50 is illustratively formed in a p-type substrate 60 which also has a more heavily doped p-type well 61. The photoconversion device 50 is illustratively a photodiode and may be a p-n junction photodiode, a Schottky photodiode, or any other suitable photodiode, but for exemplary purposes is discussed as a pinned p-n-p photodiode with pin potential $V_{PIN1}$.

The exemplary pinned photodiode 50, as shown in FIG. 5, includes a p+ region 22 and an n-type region 24 associated with p-substrate 60. The remaining structures shown in FIG. 5 include a transfer transistor with associated gate 26 and a reset transistor with associated gate 28. Shallow trench isolation (STI) regions 55, used for isolating pixels, and source/drain regions 30 and 41 are also shown. A source follower transistor 33 and row select transistor 35 with associated gates are also included in the pixel sensor cell, but are schematically shown rather than being shown in a cross-sectional view, with the output of the row select transistor 35 being connected with a column readout line 37. Although shown in FIG. 5 as a 4-transistor (4T) configuration with a transfer transistor, the invention can also be utilized in a 3-transistor (3T) configuration, without a transfer transistor where the region 24 is directly coupled to floating diffusion region 43, and in pixels with other higher transistor number configurations.

As shown in FIG. 5, the floating diffusion region 43 is constructed as a pinned diode floating diffusion region. The pinned diode floating diffusion region 43 has a p+ region 40 within n-type region 41. The p+ type region 40 of the floating diffusion region 43 is preferably located adjacent and below the sidewall of transfer gate 26 so as to create symmetry with the p+ region 22 of photodiode 50 located on the opposite side of transfer gate 26. Though not essential, an n+ contact region 42 can also be formed in n-type region 41 to provide a good ohmic contact to contact 27 in the form of a conductive plug.

As discussed above, photodiode 50 and the diode (regions 40, 41) in floating diffusion region 43 should have different pin potentials in order to obtain dual slope output voltage function depicted in FIG. 7. In this embodiment, $V_{PIN2}$ of the floating diffusion region 43 can be made higher than $V_{PIN1}$ of the photodiode 50 by adjusting implantation conditions such as angle and dosages.

Contact 27 is electrically connected through the n+ type region 42 to the floating diffusion region 43. The n+ region 42 is formed through an after-contact etch-implantation step, which reduces potential barriers. An optional storage capacitor 31 may be connected to the pinned floating diffusion region 43 by way of contact 27. Storage capacitor 31 has a first electrode 34 and a second electrode 32 with a dielectric layer between the electrodes 32, 34. In this embodiment, contact 27 is connected to a storage capacitor 31 to increase charge storage capacitance of floating diffusion region 43, however the image sensor may be formed without the storage capacitor 31.

Figure 6:
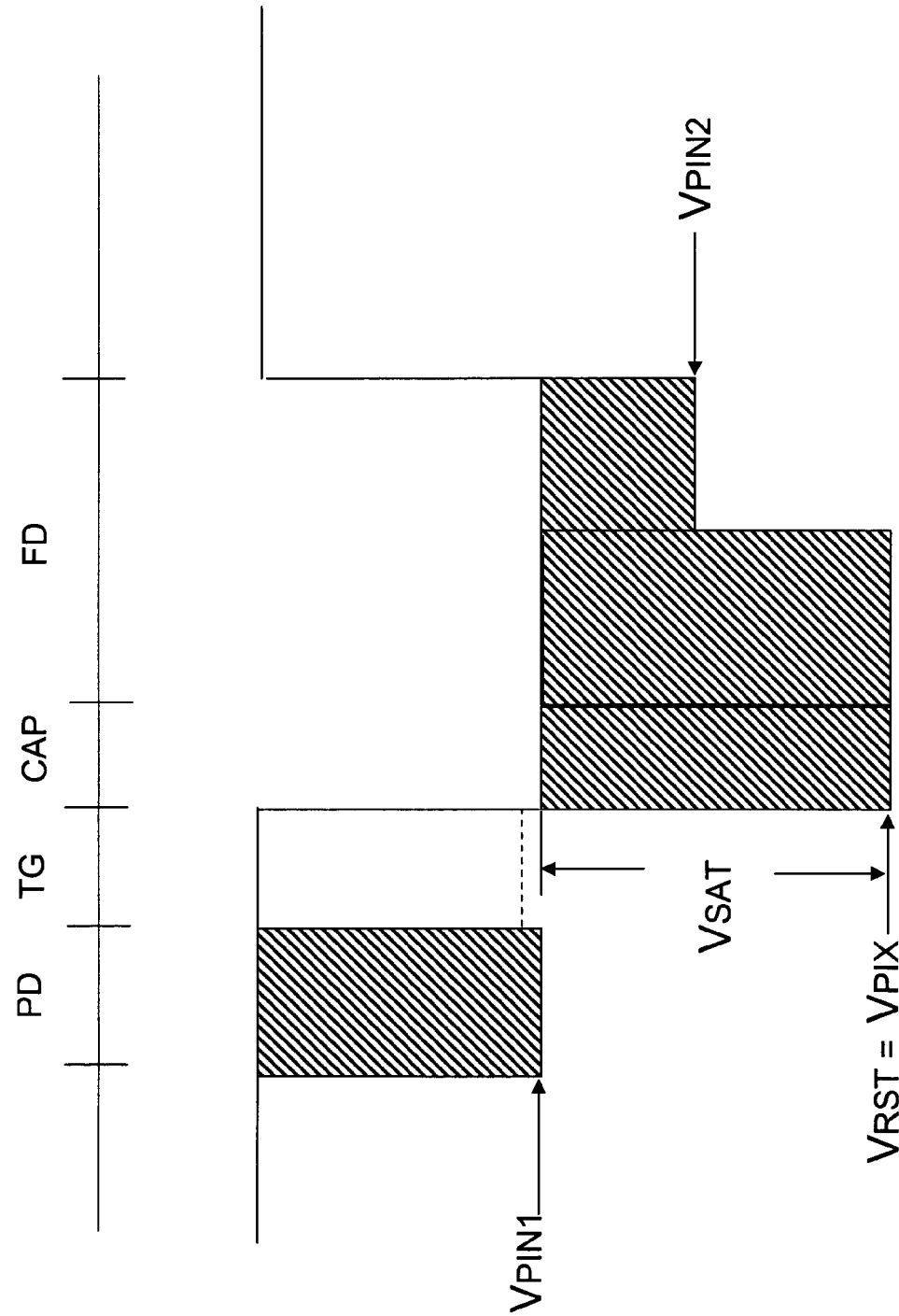
FIG. 6 is a potential diagram for the pixel of FIG. 5.

Referring to FIG. 6, the potential diagram of a pixel cell constructed in accordance with the FIG. 5 embodiment of the invention having capacitor 31 is depicted. FIG. 7 illustrates the output voltage transfer function for this embodiment.

FIG. 6 shows the case where the reset voltage $V_{RST}$ applied to the floating diffusion region equals the pixel supply voltage $V_{PIX}$ on electrode 32 of capacitor 31. As a result, after reset and when the transfer gate 26 is turned on and the transfer gate barrier potential is lowered to close to $V_{PIN1}$, as shown by the dotted line, electrons flow first to electrode 34 and to the parasitic capacitance of floating diffusion region 43. Then when $V_{PIN2}$ is reached, electrons also flow to the extra storage area created by pinned diode of floating diffusion region 43. Because of the additional capacitance produced by the pinned diode, output voltage rises more slowly as a function of transferred charge.

Figure 2:
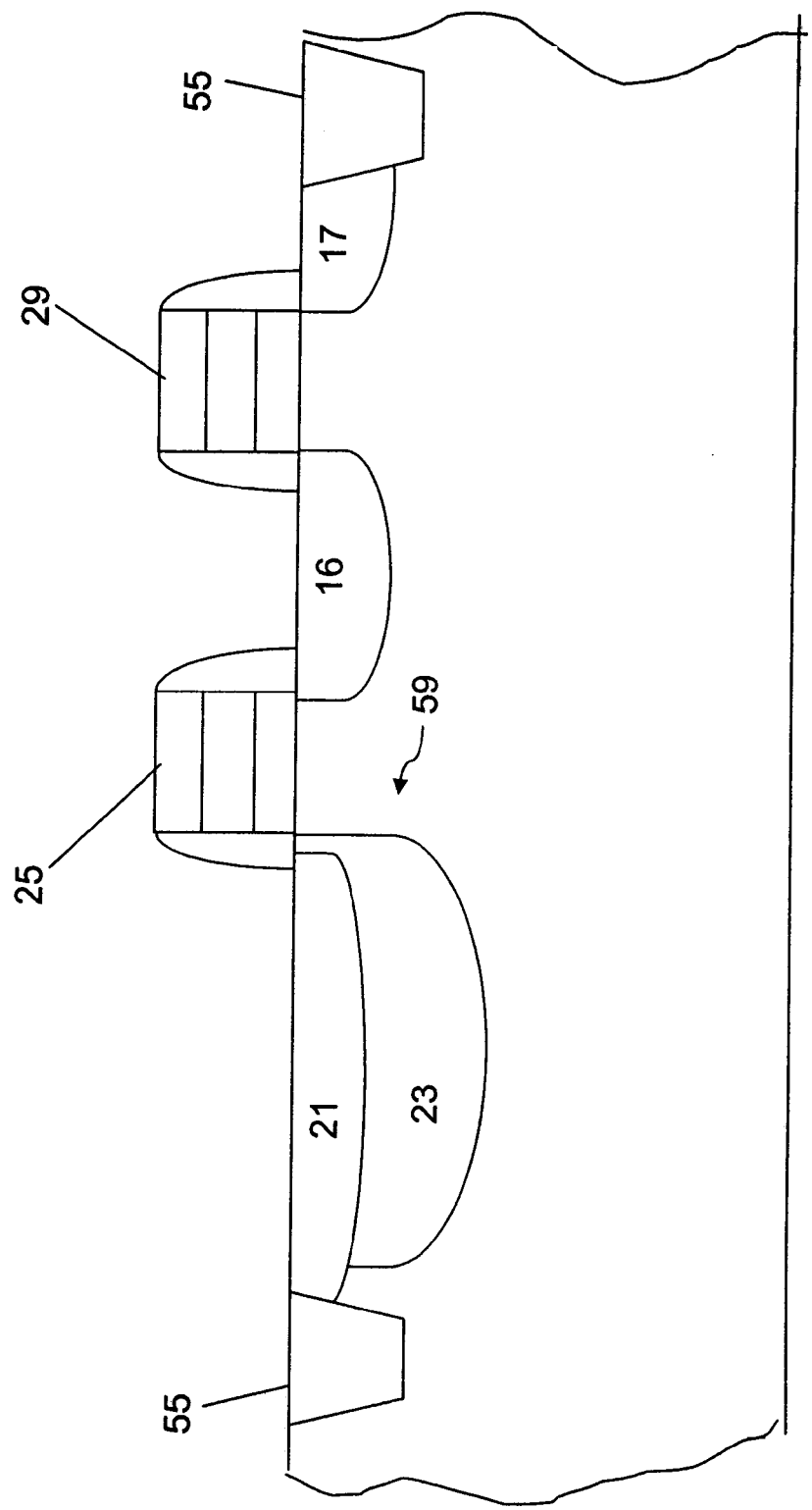
FIG. 2 is a cross-sectional view of a portion of a pixel of a conventional image sensor.
Figure 3:
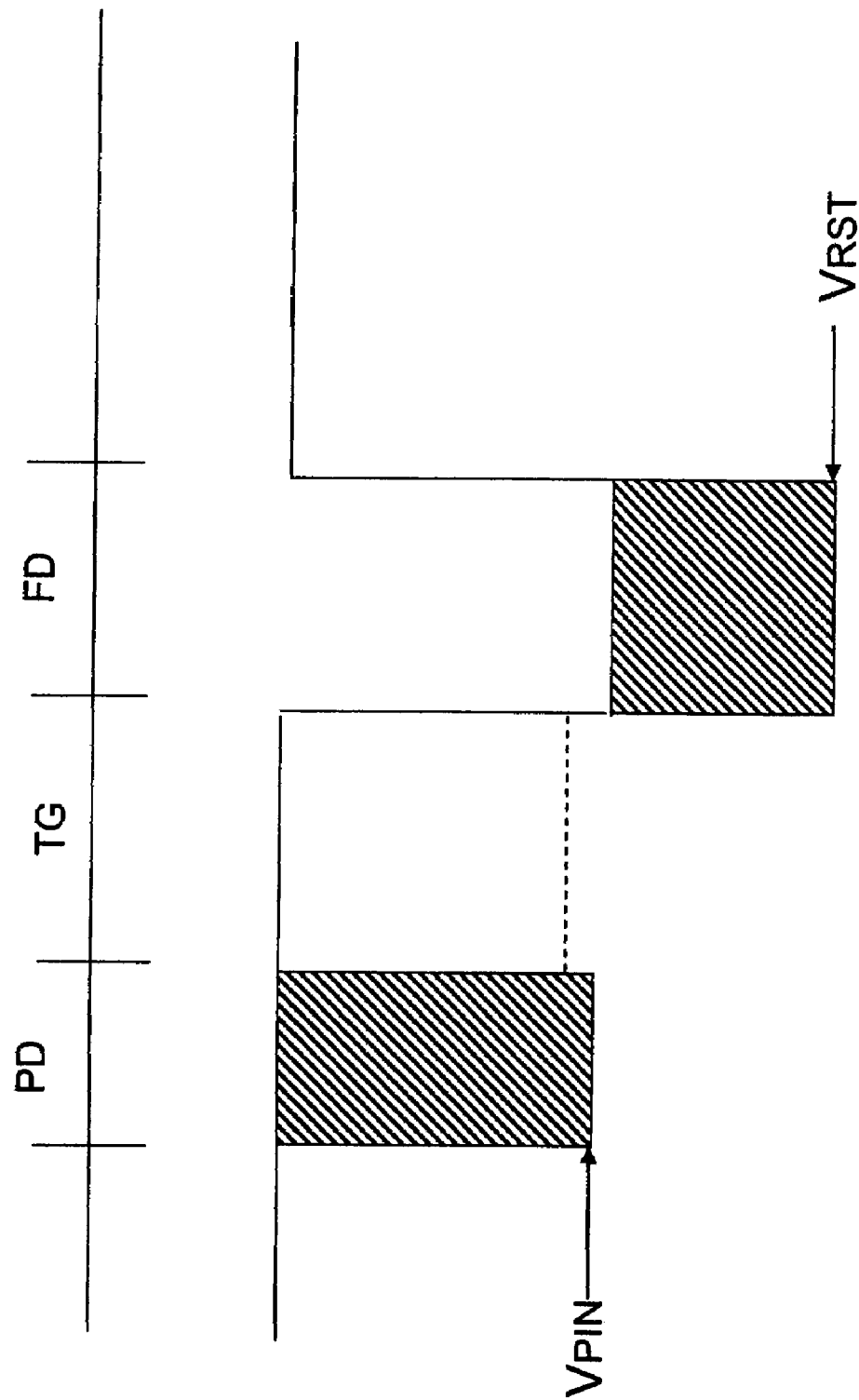
FIG. 3 is a potential diagram for the pixel depicted in FIG. 2.
Figure 4:
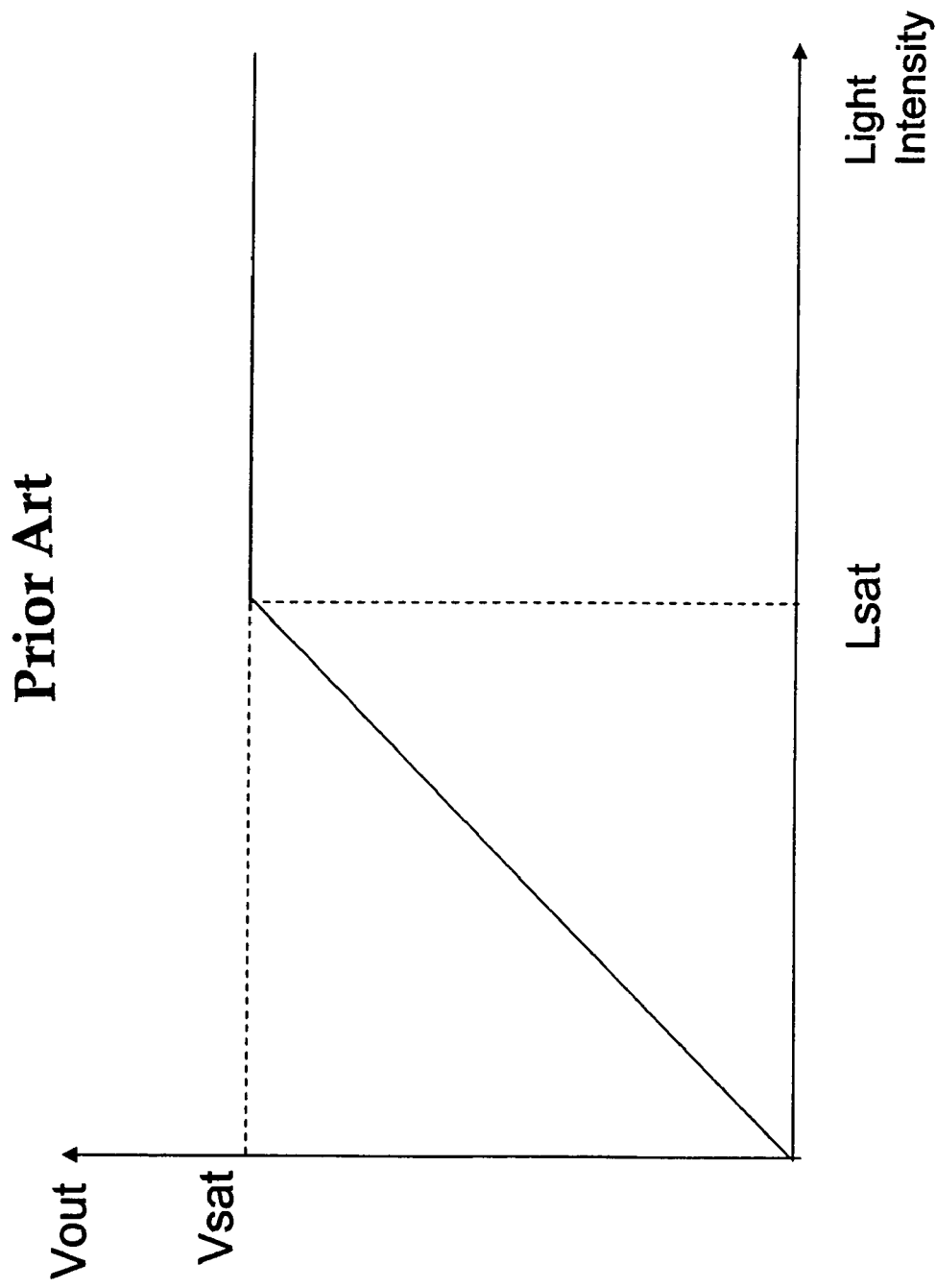
FIG. 4 is a graph showing output voltage as a function of input light signal for the FIG. 2 pixel.

As shown in FIG. 7, a two slope charge transfer characteristic is produced, which contrasts with the FIG. 4 graph for a conventional image sensor. The conventional image sensor reaches a saturation point more quickly after one linear slope step (FIG. 4), while the pixel of FIG. 5 has first and second operating ranges with different output voltage slopes. If the floating diffusion region potential is less than $V_{PIX}-V_{PIN2}$ after transfer of the charge carriers to the floating diffusion region, as may be the case in a low light situation, the pixel of the FIG. 5 acts much like the pixel of FIG. 2, having an output voltage function that rises at a linear slope with increasing light intensity, as shown in FIG. 4. However, if the floating diffusion region potential reaches a value greater than $V_{PIX}-V_{PIN2}$ as may be the case with higher light intensities, the slope of the output voltage function is lowered, allowing a higher light intensity change to be received before the floating diffusion region saturates, at $V_{SAT}$.

FIG. 7 also shows the operating situation under conditions of three different pixel supply voltages which are applied at electrode 32 of the capacitor 31 to produce different pixel saturation levels. $V_{PIXA}$, $V_{PIXB}$ and $V_{PIXC}$ represent different (decreasing) voltages for $V_{PIX}$. As $V_{PIX}$ is lowered, so too is the pixel saturation voltage. In all cases of $V_{PIXA}$, $V_{PIXB}$ and $V_{PIXC}$, the pinned diode floating diffusion region 43 allows receipt of more charge at the diffusion region 43 before saturation is reached and the output voltage of the pixel, taken off floating diffusion region 43, has two associated slopes for accumulated charges.

Figure 8:
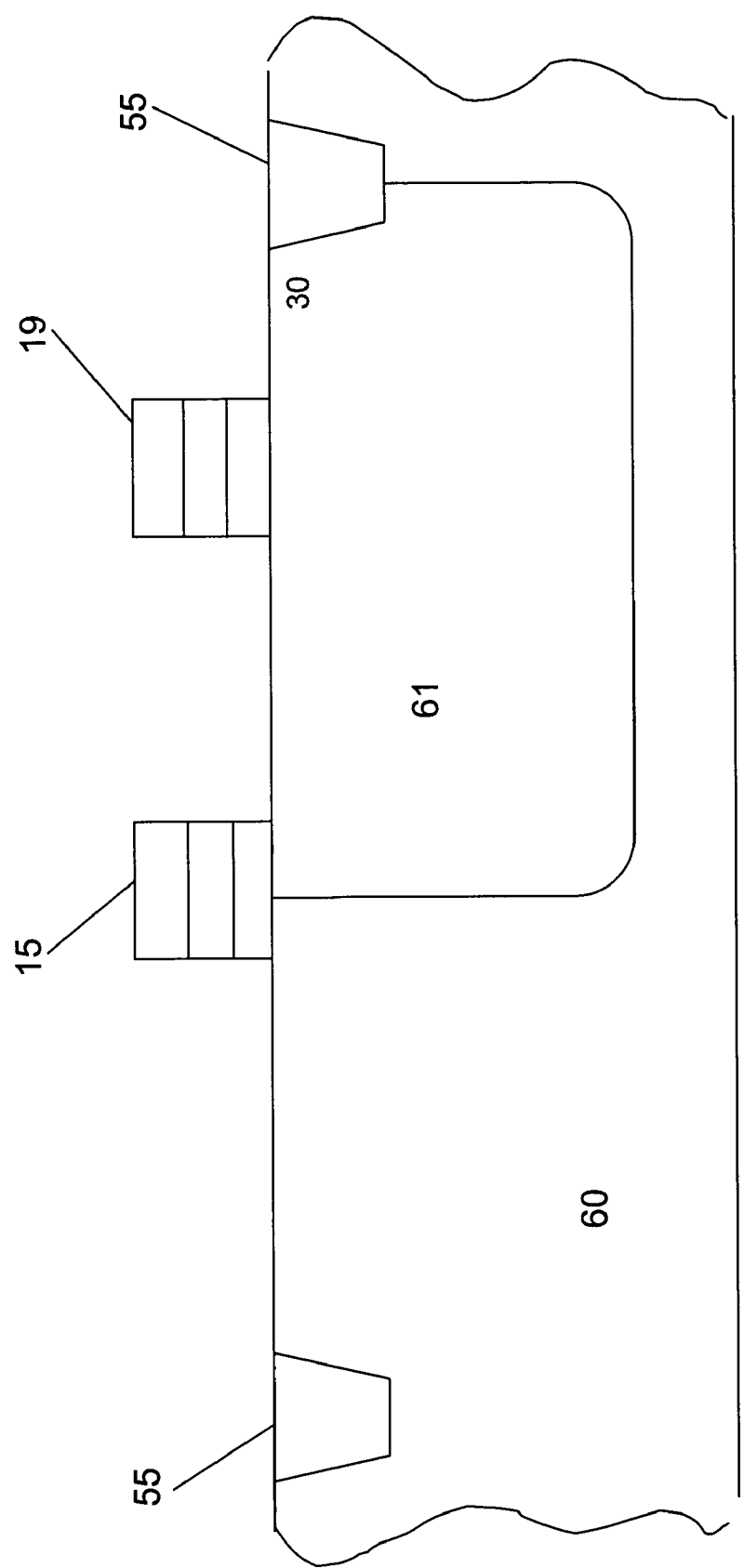
FIG. 8 shows a cross-sectional view of a portion of the FIG. 5 photodiode during an initial stage of processing performed in accordance with a method of fabricating the FIG. 5 embodiment of the invention.

FIGS. 8–13 show one exemplary method of forming a pixel sensor cell with a pinned diode floating diffusion region 43 at various stages of formation. For convenience, the same cross-sectional view of FIG. 5 is utilized in FIGS. 8–13 for the ensuing description, so the source follower and row select transistors are not illustrated. The pinned floating diffusion region 43 will be described as formed in a p-well 61 of a p-type substrate 60; however it may also be formed in an n-well in an n-type substrate, and other structures may also be used. First the substrate 60, as shown in FIG. 8, is formed. In this exemplary structure, substrate 60 is a p-type silicon substrate on which gate stacks 15 and 19 are formed. A p-well 61 is formed within the substrate 60. Isolation regions 55 are also formed. The p-type well 61 may be formed before or after the formation of isolation regions 55 and gate stacks 15 and 19. The p-well 61 implant may be conducted so that the pixel array well 61 and a p-type periphery logic well (not shown), which will contain logic circuits for controlling the pixel array, have different doping profiles. As known in the art, multiple high energy implants may be used to tailor the profile of the p-type well 61.

The isolation regions 55 are used to electrically isolate regions of the substrate where pixel cells will be formed. The isolation regions 55 can be formed by any known technique such as thermal oxidation of the underlying silicon in a LOCOS process, or by etching trenches and filling them with oxide in an STI (shallow trench isolation) process. Following formation of isolation regions 55 if the p-type well 61 has not yet been formed, it may then be formed by masked implantation to produce the p-type well 61.

FIG. 8 shows an exemplary embodiment with gate stacks 15, 19 for a transfer transistor and a reset transistor, respectively. Transfer gate stack 15, and reset gate stack 19 can be formed by well-known methods, e.g., blanket deposition of gate oxide, doped polysilicon, deposition of metal for a silicide, annealing to form a silicide, then patterning and etching. The invention is not limited to a particular method of forming transistor gate stacks 15, 19. Transfer gate stack 15 is illustratively shown as spanning a boundary of p-well 61, but could also be completely over p-well 61.

Figure 9:
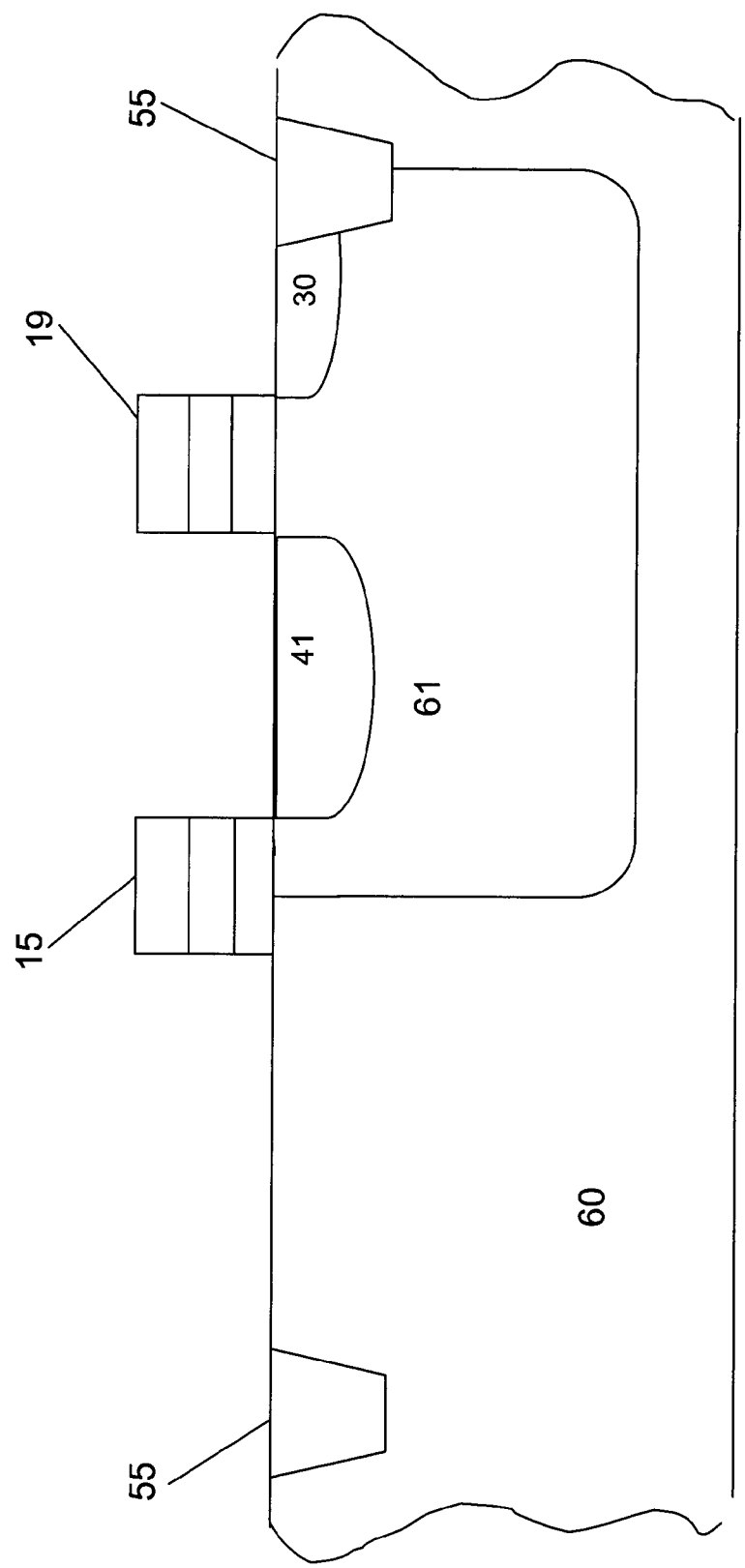
FIG. 9 shows a stage of processing subsequent to that shown in FIG. 8.

The n-type region 41 of pinned floating diffusion region 43 is also formed by ion implantation of n-type dopants, as illustrated in FIG. 9. Similarly, formed n-type source/drain regions 30 are also shown in FIG. 9. For exemplary purposes, regions 30 are n+ doped and may be formed by applying a mask to the substrate and doping the regions 30 by ion implantation.

Figure 10:
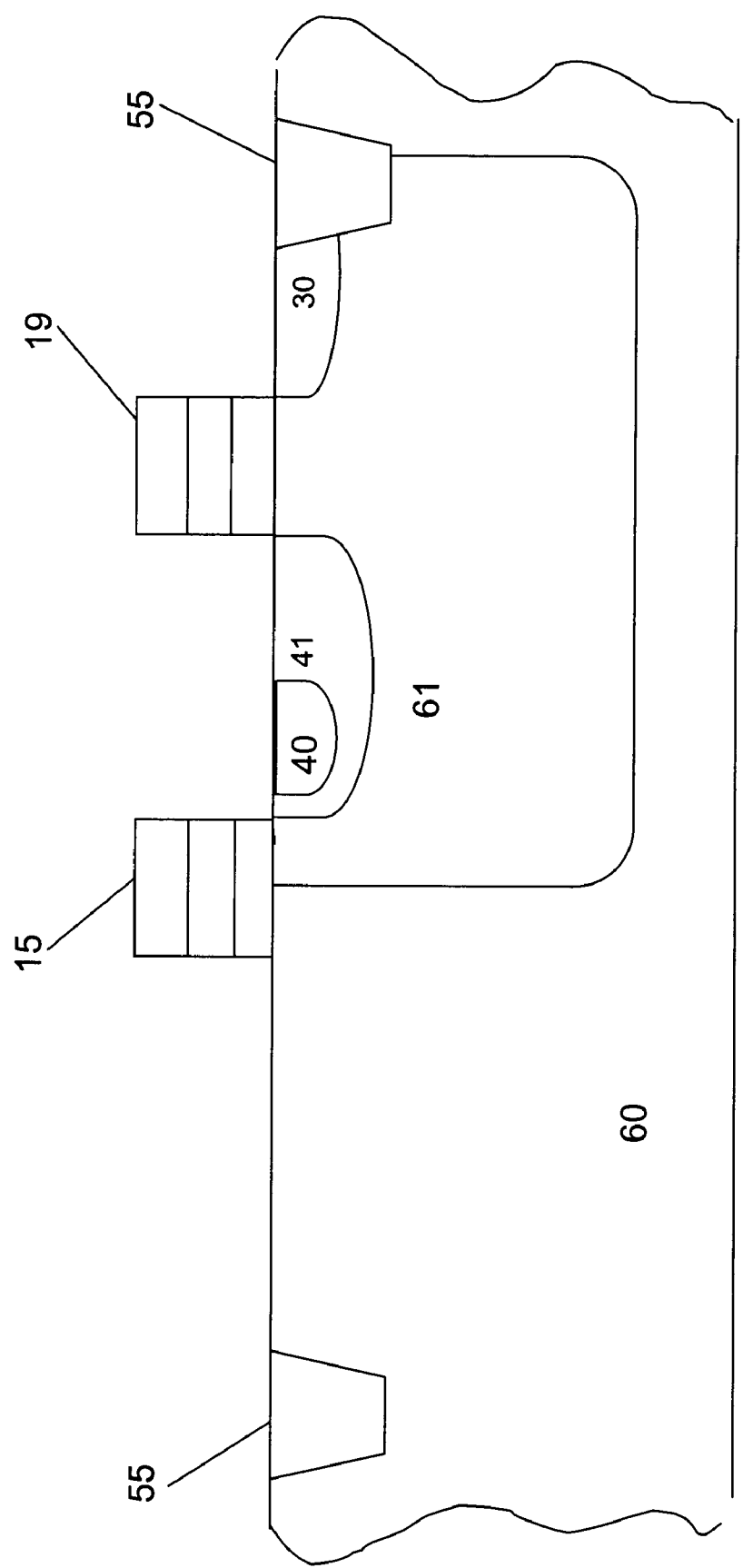
FIG. 10 shows a stage of processing subsequent to that shown in FIG. 9.

FIG. 10 shows the formation of p+ region 40, located close to transfer gate stack 15 and within n-type region 41, thereby forming a p/n diode. Region 40 is p+ doped in this embodiment and is not extended to the channel region of reset gate stack 19. In this embodiment, region 40 and subsequently formed n+ contact region 42 (FIG. 5) should be separated and not associated with one another. Region 42 is formed later after formation of an opening in an overlying insulation layer for formation of contact 27 through an etch-implantation step, discussed below.

Figure 11:
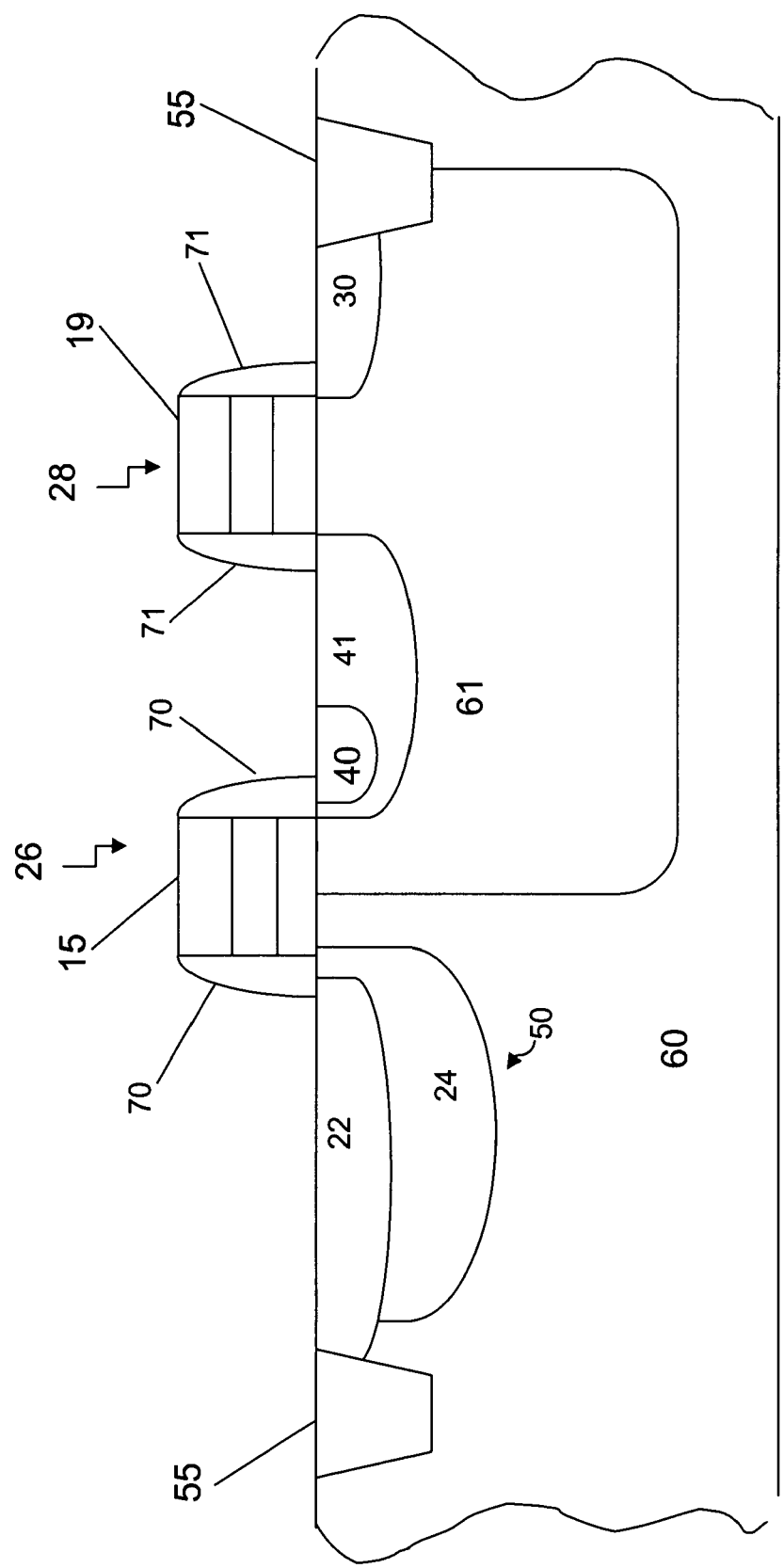
FIG. 11 shows a stage of processing subsequent to that shown in FIG. 10.

FIG. 11 illustrates implantation of pinned photodiode 50, having p-type region 22 and n-type region 24. Regions 22 and 24 of photodiode 50 are implanted by any methods known in the art at any conventional point in the fabrication process and could be implanted in several steps, some preceding the fabrication state depicted in FIG. 9 and some after. After formation of regions, 40, 22 and 24, gate stack sidewall insulators 70, 71 are formed on the sides of the gate stacks 15, 19, respectively, using conventional techniques to form transistors with associated gates 26, 28. Gate stack sidewall insulators are also formed on other remaining gate stacks not shown in FIG. 11.

Figure 12:
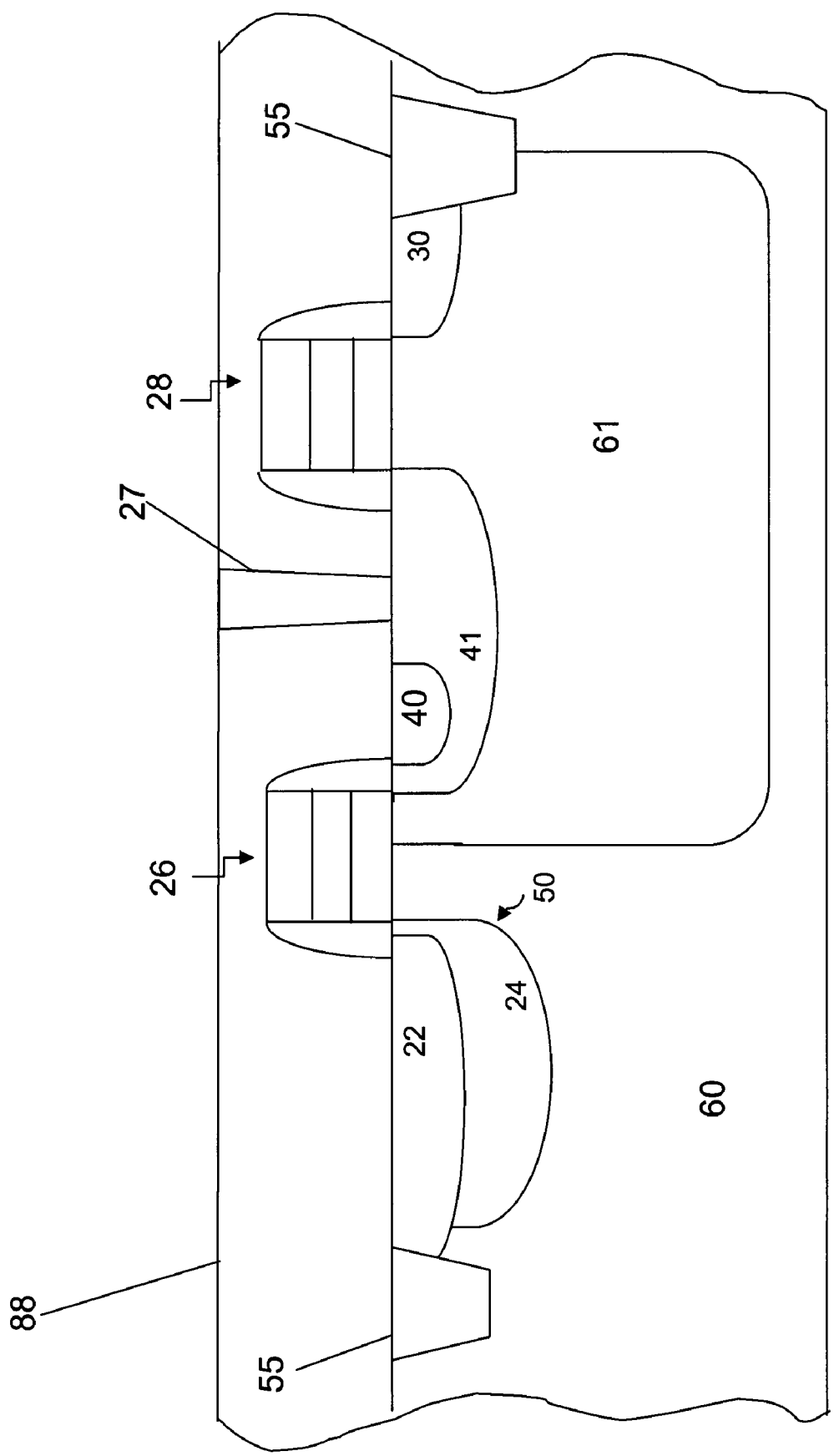
FIG. 12 shows a stage of processing subsequent to that shown in FIG. 11.

Conventional processing methods may be used to form insulating, shielding, and metallization layers to connect gate lines and make other connections to the pixel cells. For example, the entire surface may be covered with a passivation layer 88 of, for example, silicon dioxide, BSG, PSG, or BPSG, which is CMP planarized and etched to provide contact holes, which are then metallized to provide contacts. FIG. 12 shows the formation of passivation layer 88 of BPSG and a contact opening therein to floating diffusion region 43.

Figure 13:
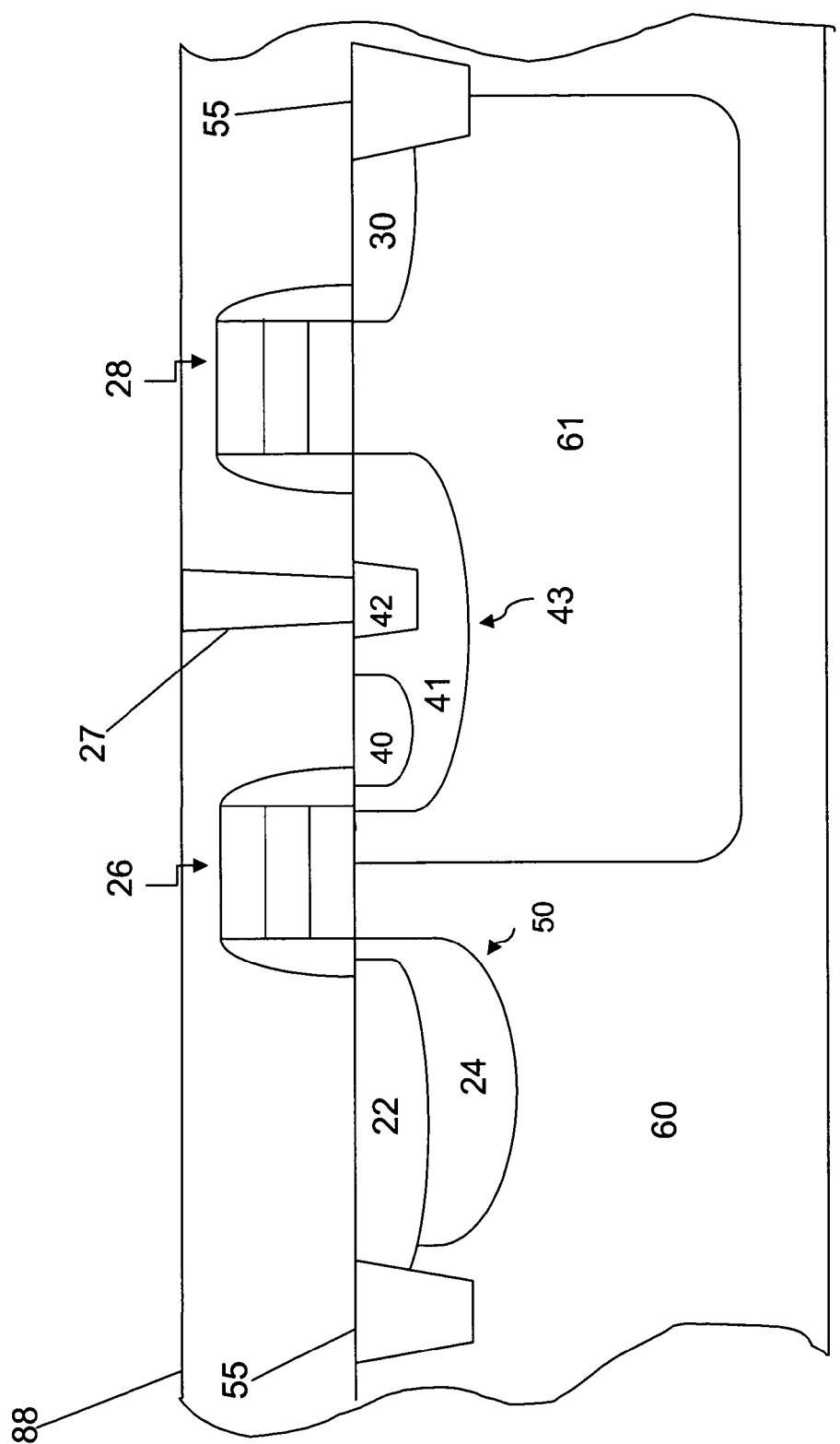
FIG. 13 shows a stage of processing subsequent to that shown in FIG. 12.

After the contact opening is formed, region 42 is formed within the n-type region 41 by an etch-implantation step as shown in FIG. 13. For exemplary purposes, region 42 is doped n+ type and is doped at a higher concentration than the n-type region 41 to provide a good ohmic contact. After region 42 is implanted, contact 27 is formed in the contact opening. Region 42 is connected to contact 27 and located within region 41, but is separated from and not associated with, and does not interfere with, p+ region 40. A storage capacitor 31 (FIG. 9) may be optionally formed over the passivation layer 88 or at another surface portion of substrate 60 by methods known in the art. Conventional layers of conductors and insulators may also be used to interconnect the structures, to connect the pixel to peripheral circuitry and to protect the circuitry from the environment.

Figure 14:
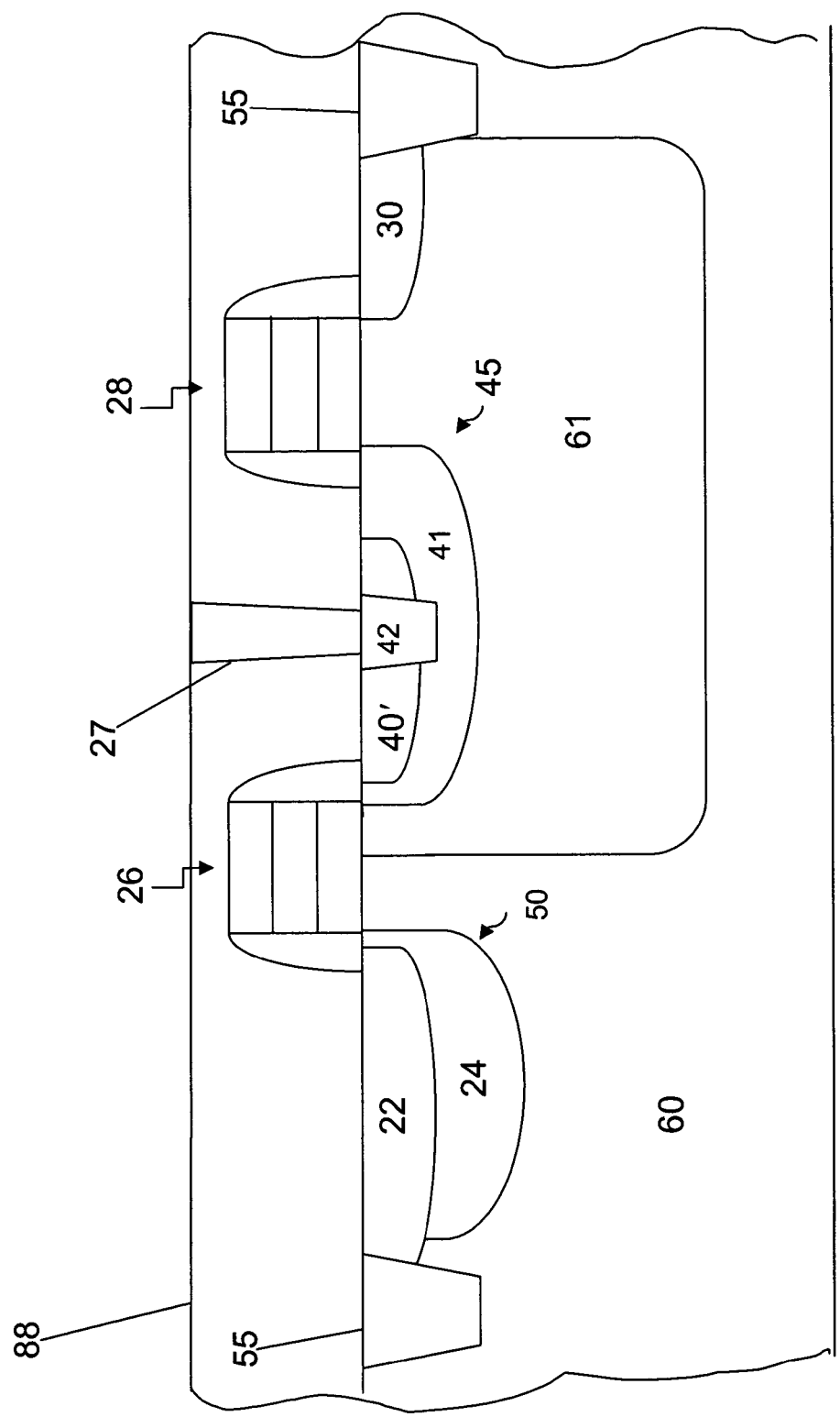
FIG. 14 shows a cross-sectional view of a portion of a pixel of an image sensor according to another embodiment of the invention.

FIG. 14 shows another pixel cell embodiment of the invention. In this embodiment, p+ region 40' of pinned diode floating diffusion region 45 surrounds n+ region 42, but does not extend into the portion of region 41 under the reset transistor gate 28. Unlike the embodiment shown in FIG. 5 above, p+ region 40' and n+ region 42 are not separated from one another. Region 42 of this embodiment is positioned to extend beyond the bottom edge of p+ region 40' such that n+ region 42 extends into the n-type region of pinned diode floating diffusion region 45.

Figure 15:
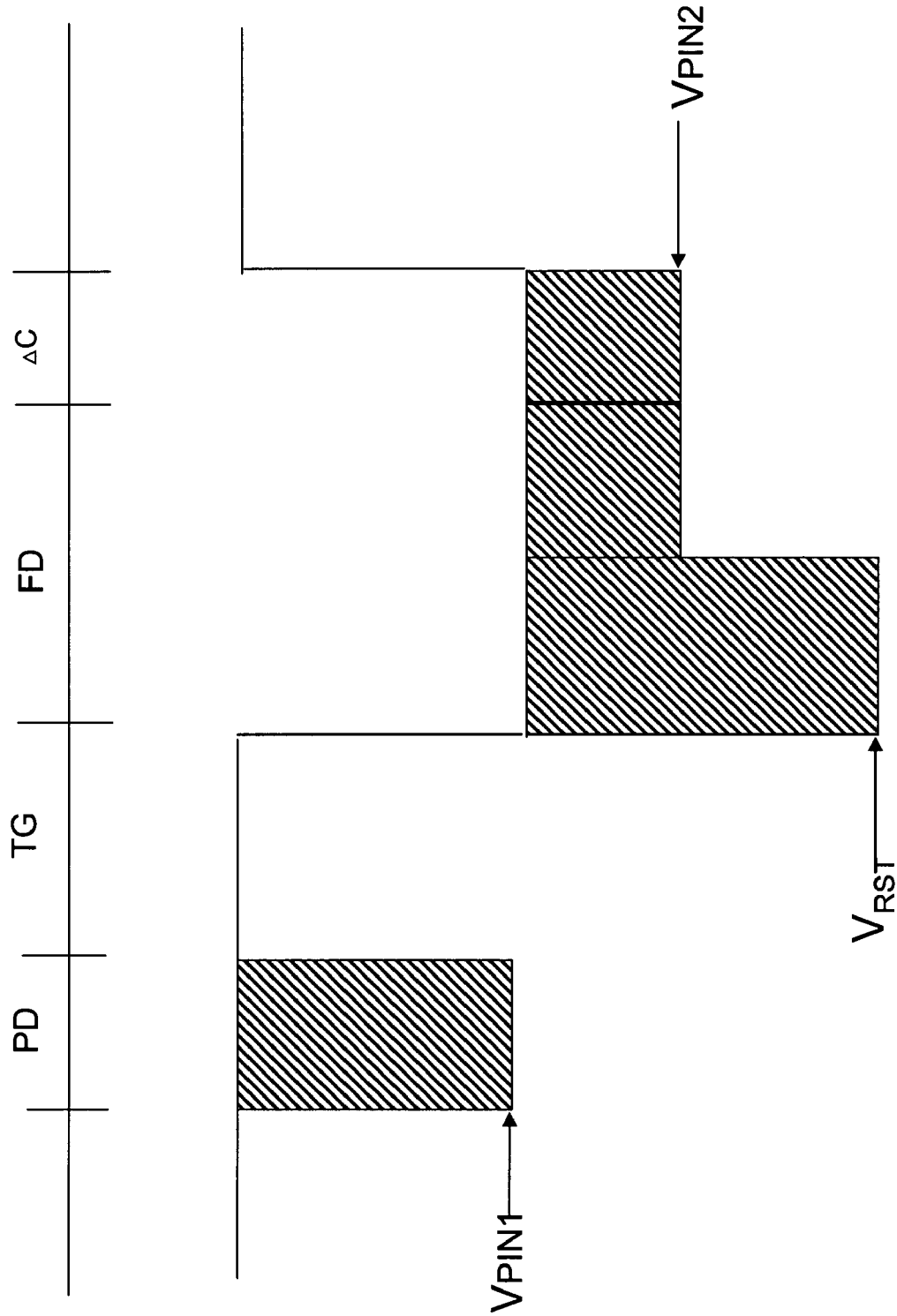
FIG. 15 is a potential diagram for the image sensor of FIG. 14.

The process for forming the embodiment shown in FIG. 14 is similar to the process shown in FIGS. 8–13, with the following exceptions. The p+ region 40' is implanted such that it extends over a greater portion of floating diffusion region 45 and n+ region 42 is implanted into n-type region 41. The embodiment shown in FIG. 14 has a modified potential diagram, compared with that of FIG. 5, as shown in FIG. 15. Additional storage capacitance (ΔC) is added when the p+ region 40' surrounds the n+ region 42 and the n+ region 42 has contact with the n-type region 41, the p+ region 40' and the contact 27. The embodiment of FIG. 14 may also include or omit a capacitor 31, shown in FIG. 5.

FIG. 15 shows a potential diagram for the embodiment of FIG. 14. Because p+ region 40' surrounds n+ region 42, capacitance of the pinned diode is increased, as shown by ΔC. As a result, even without an external capacitor, $V_{SAT}$ is reached more slowly.

Figure 16:
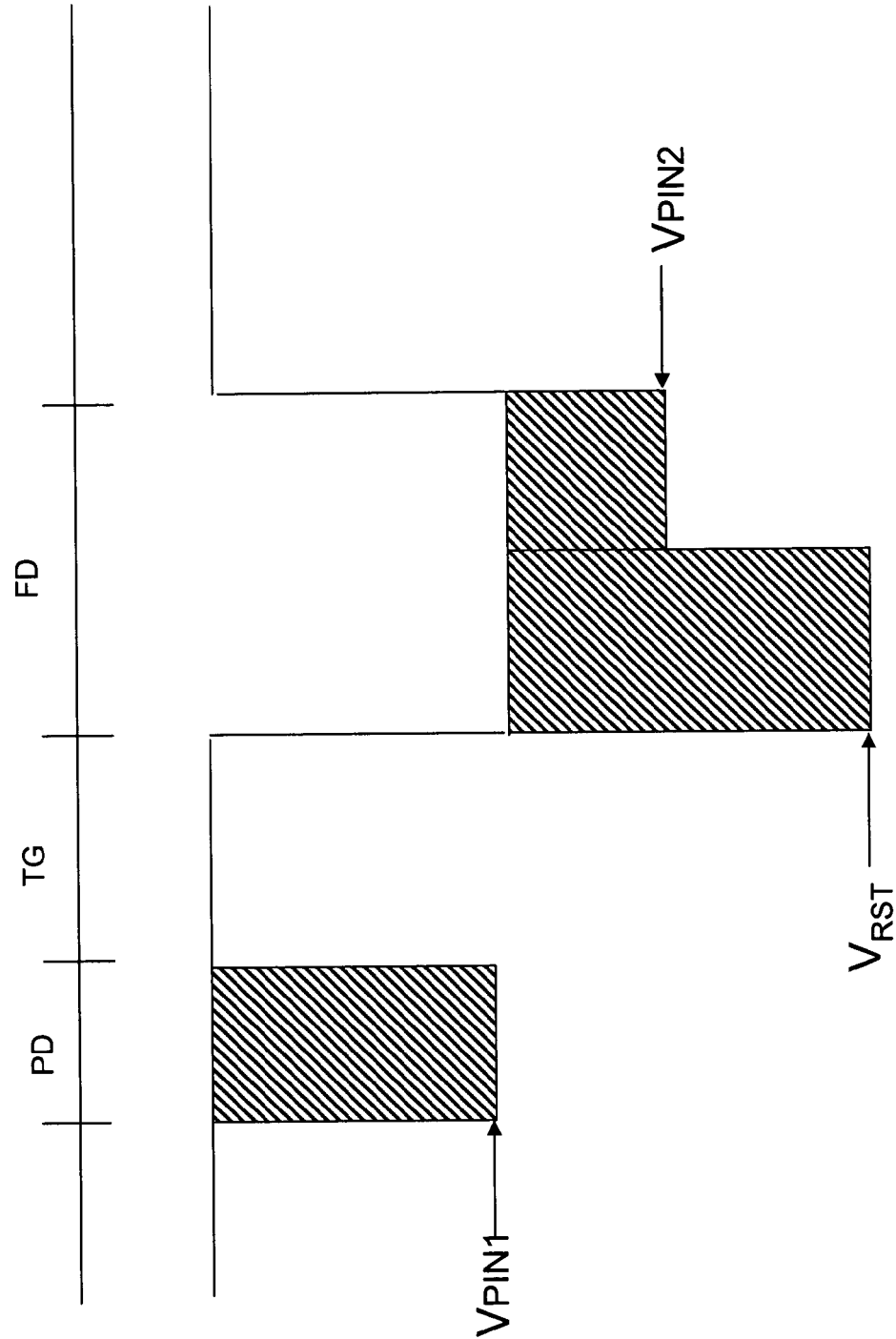
FIG. 16 is a potential diagram for another embodiment according to the invention.

The charge diagram of FIG. 15 omits any charge capacitance associated with an external capacitor such as capacitor 31 (FIG. 5) and charge storage region CAP in FIG. 6. FIG. 16 shows the potential diagram of the FIG. 5 embodiment, but omitting an external capacitor 31. The additional storage capacitance ΔC produced by the larger p+ region 40' in the FIG. 14 embodiment compared with the p+ region 40 in the FIG. 5 embodiment can be readily seen by comparing FIGS. 15 and 16.

Figure 1:
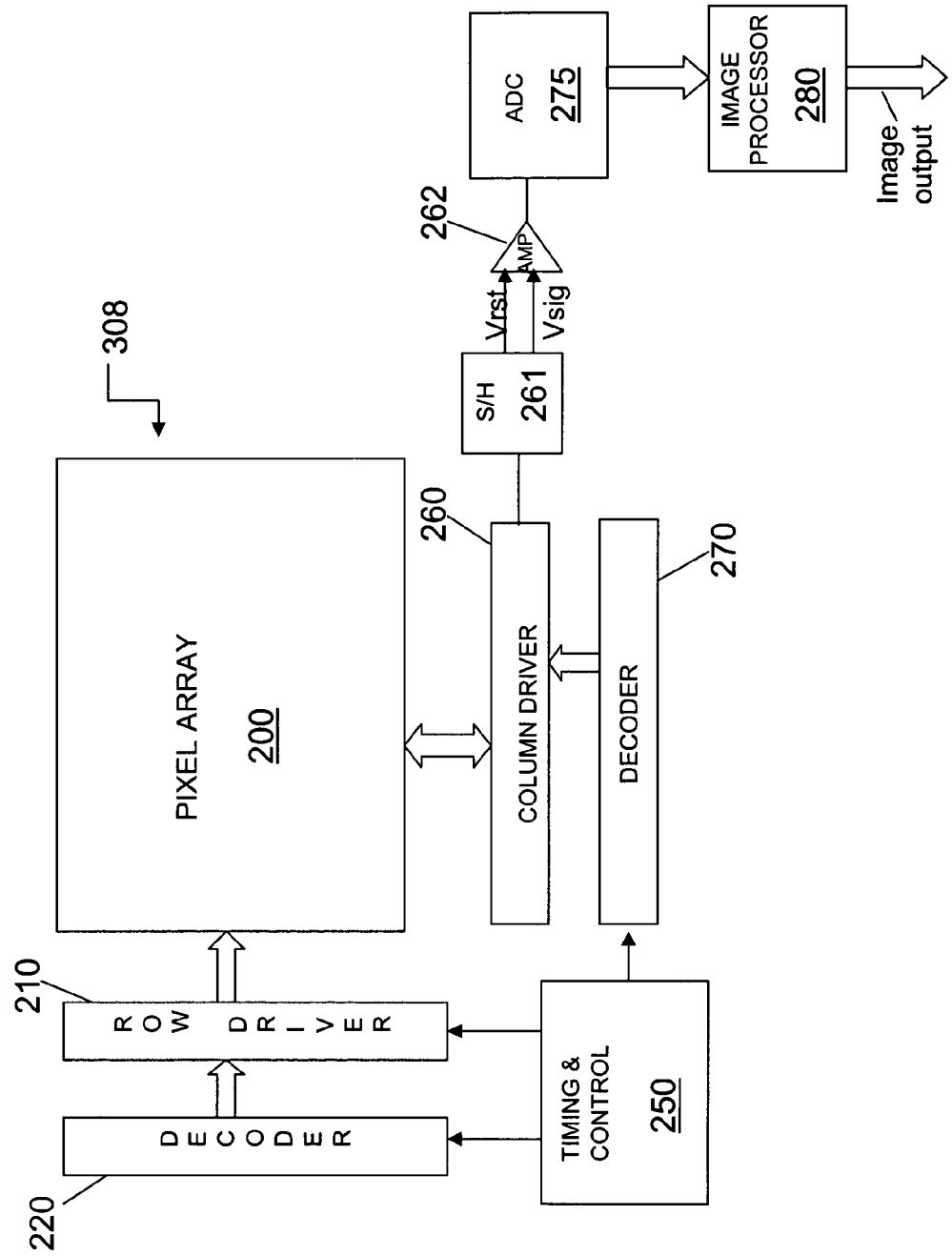
FIG. 1 is a block diagram of a conventional imager device having a pixel array.
Figure 17:
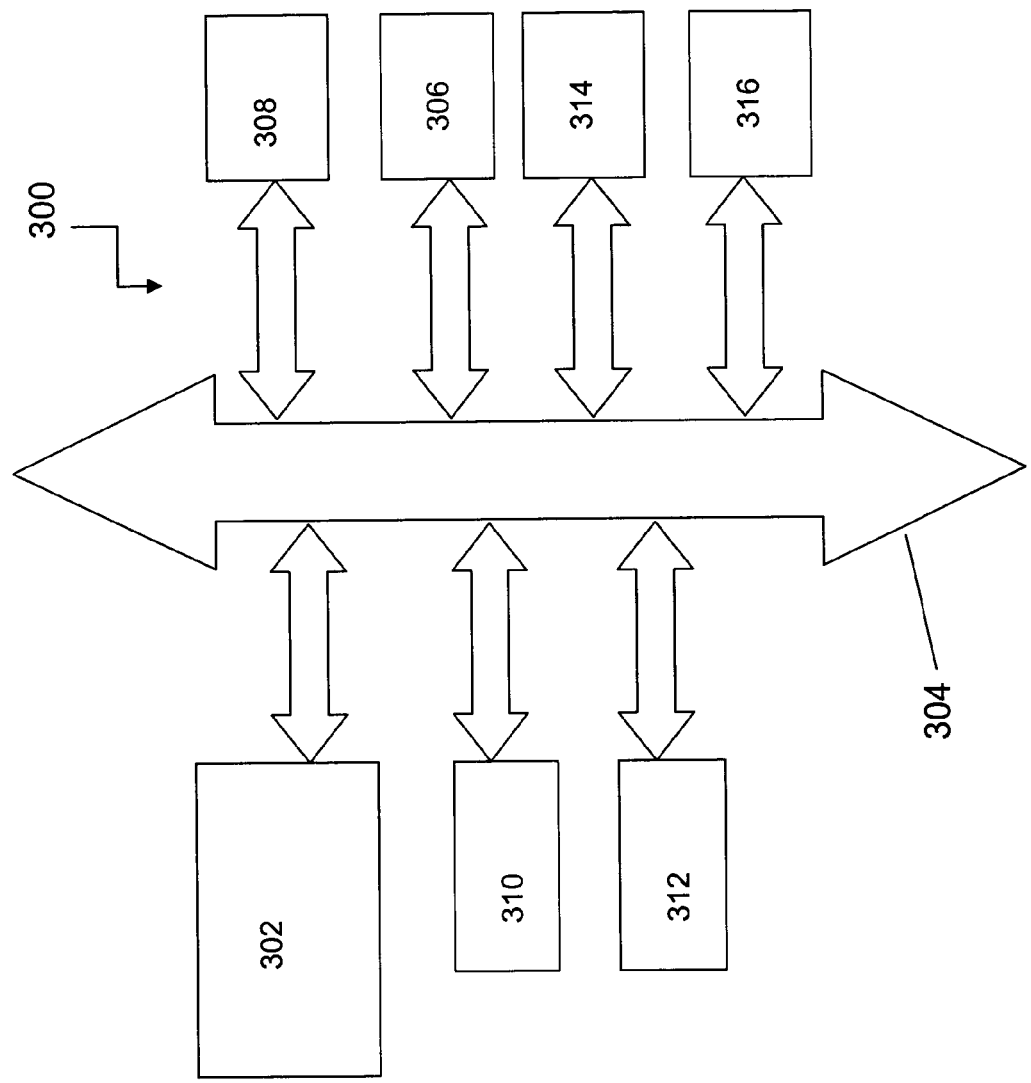
FIG. 17 is a schematic diagram of a processing system employing an imager constructed in accordance with any of the various embodiments of the present invention.

FIG. 17 shows a processor system 300, which includes an imager device 308 having the overall configuration depicted in FIG. 1, but with pixels of array 200 constructed in accordance with any of the various embodiments of the invention. System 300 includes a processor 302 having a central processing unit (CPU) that communicates with various devices over a bus 304. Some of the devices connected to the bus 304 provide communication into and out of the system 300; an input/output (I/O) device 306 and imager device 308 are examples of such communication devices. Other devices connected to the bus 304 provide memory, illustratively including a random access memory (RAM) 310, hard drive 312, and one or more peripheral memory devices such as a floppy disk drive 314 and compact disk (CD) drive 316. The imager device 308 may be constructed as shown in FIG. 1 but with the pixel array 200 having the characteristics of an embodiment of the invention such as those described above in connection with FIGS. 5–16. The imager device 308 may receive control or other data from CPU 302 or other components of system 300. The imager device 308 may, in turn, provide signals defining images to processor 302 for image processing, or other image handling operations.

The invention has been described in terms of a floating diffusion region with a pinned diode, but other structures to provide a change in slope of output voltage as light intensity rises will be within the scope of the invention. Also, the invention has been described in relation to electron transfer, but could also be applied to transfer of holes to a depletion photodiode.

The processes and devices described above illustrate preferred methods and typical devices of many that could be used and produced. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by letters patent of the United States is:

1. A pixel sensor cell comprising:
a substrate of a first conductivity type;
a photoconversion device comprising a region of a second conductivity type within said substrate and having a first pinning potential;
a charge collection region for receiving charges from said photoconversion device, said charge collection region comprising a region of said first conductivity type at an upper surface of a region of said second conductivity type and having a second pinning potential, wherein said second pinning potential is different from said first pinning potential; and
a transfer transistor for transferring charge from said photoconversion device to said charge collection region.

2. The pixel sensor cell according to claim 1 wherein said charge collection region is a floating diffusion region.

3. The pixel sensor cell according to claim 1 wherein said photoconversion device is a photodiode.

4. The pixel sensor cell according to claim 3 wherein said photodiode is a pinned photodiode.

5. The pixel sensor cell according to claim 1 wherein said charge collection region is within a region of said first conductivity type.

6. The pixel sensor cell according to claim 1 wherein said second conductivity type region is an n-type region, wherein said first conductivity type region is a p+ type region formed within said n-type region.

7. The pixel sensor cell according to claim 6 further comprising an n+ type region within said n-type region.

8. The pixel sensor cell according to claim 7 wherein said n+ type region and said p+ type region are separated from one another by a portion of said n-type region.

9. The pixel sensor cell according to claim 7 wherein said p+ type region surrounds said n+ type region, said n+ type region extending into said n-type region.

10. The pixel sensor cell according to claim 7 wherein said n+ type region is associated with a contact.

11. The pixel sensor cell according to claim 6 wherein said p+ type region is located adjacent to a gate of said transfer transistor.

12. The pixel sensor cell according to claim 6 wherein said p+ type region does not contact a reset transistor gate channel region.

13. The pixel sensor cell according to claim 1 further comprising an external storage capacitor electrically connected to said charge collection region.

14. A pixel sensor cell comprising:
a photoconversion device having a first pinning potential;
a charge collection region for receiving charges from said photoconversion device and having a second pinning potential, wherein said second pinning potential is different from said first pinning potential, said charge collection region comprising:
a first doped region of a second conductivity type for receiving charges from said photoconversion device, a second doped region of a first conductivity type within said first doped region and a third doped region of said second conductivity type within said first doped region; and
a transfer transistor for transferring charge from said photoconversion device to said charge collection region and wherein said second doped region and first doped region form a diode and said second doped region is adjacent a gate of said transfer transistor.

15. The pixel sensor cell according to claim 14 wherein said third doped region is implanted with a higher dopant concentration of said second conductivity type than said first doped region of said charge collection region.

16. The pixel sensor cell according to claim 14 wherein said charge collection region is a floating diffusion region.

17. The pixel sensor cell according to claim 14 wherein said photoconversion device is a photodiode.

18. The pixel sensor cell according to claim 17 wherein said photodiode is a pinned photodiode.

19. The pixel sensor cell according to claim 14 wherein said second doped region is doped p+.

20. The pixel sensor cell according to claim 14 wherein said second doped region and said third doped region are separated from one another by a portion of said first doped region.

21. A pixel sensor cell comprising:
a photoconversion device having a first pinning potential ($V_{PIN1}$);
a charge collection region for receiving charges from said photoconversion device and having a second pinning potential ($V_{PIN2}$) wherein $V_{PIN2}$ is greater than WINi, said charge collection region comprising:
a first doped region of a second conductivity type for receiving charges from said photoconversion device, a second doped region of a first conductivity type within said first doped region and a third doped region of said second conductivity type within said first doped region; and
a transfer transistor for transferring charge from said photoconversion device to said charge collection region and wherein said second doped region and first doped region form a diode and said second doped region is adjacent a gate of said transfer transistor.

22. A pixel sensor cell comprising:
a photoconversion device;
a charge collection region for receiving charges from said photoconversion device, said charge collection region comprising:
a first doped region of a second conductivity type for receiving charges from said photoconversion device, a second doped region of a first conductivity type within said first doped region and a third doped region of said second conductivity type within said first doped region;
a storage capacitor connected to said third doped region; and
a transfer transistor for transferring charge from said photoconversion device to said charge collection region and wherein said second doped region and first doped region form a diode and said second doped region is adjacent a gate of said transfer transistor.

23. The pixel sensor cell according to claim 22 wherein said storage capacitor is connected to said third doped region via a contact.

24. The pixel sensor cell according to claim 23 wherein said contact is a low ohmic contact.

25. A pixel sensor cell comprising:
a photoconversion device;
a charge collection region for receiving charges from said photoconversion device, said charge collection region comprising:
a first doped region of a second conductivity type for receiving charges from said photoconversion device, a second doped region of a first conductivity type within said first doped region and a third doped region of said second conductivity type within said first doped region, wherein said second doped region surrounds said third doped region, said third doped region extending into said first doped region; and
a transfer transistor for transferring charge from said photoconversion device to said charge collection region and wherein said second doped region and first doped region form a diode and said second doped region is adjacent a gate of said transfer transistor.

26. A processing system comprising:
a processor; and
an imager coupled to said processor, comprising pixel sensor cells, wherein each pixel sensor cell comprises:
a substrate of a first conductivity type;
a photoconversion device comprising a region of a second conductivity type within said substrate and having a first pinning potential;
a charge collection region for receiving charges from said photoconversion device, said charge collection region comprising a region of said first conductivity type at an upper surface of a region of said second conductivity type and having a second pinning potential, wherein said second pinning potential is different from said first pinning potential;
a transfer transistor for transferring charge from said photoconversion device to said charge collection region; and
a readout circuit comprising at least an output transistor.

27. The system according to claim 26 wherein said charge collection region is a floating diffusion region.

28. The system according to claim 26 further comprising a storage capacitor electrically connected to said charge collection region.

29. The system according to claim 26 wherein said imager is a CMOS imager.

30. A pixel sensor cell comprising:
a substrate of a first conductivity type;
a photoconversion device comprising a region of a second conductivity type within said substrate for accumulating charge and having a first pinning potential; and
a charge collection region for receiving accumulated charges from said photoconversion device and having a second pinning potential, wherein said second pinning potential is different from said first pinning potential, said charge collection region comprising an upper surface region of said first conductivity type and a well region of said second conductivity type, wherein said well region is configured to store a pixel charge to be read out as a pixel signal.

31. The pixel sensor cell according to claim 30 wherein said charge collection region is a floating diffusion region.

32. The pixel sensor cell according to claim 30 wherein said photoconversion device is a pinned photodiode.

33. The pixel sensor cell according to claim 30 wherein said charge collection region is within a region of said first conductivity type.

34. The pixel sensor cell according to claim 30 further comprising an external storage capacitor electrically connected to said charge collection region.

35. A pixel sensor cell comprising:
a photoconversion device having a first pinning potential;
a charge collection region for receiving charges from said photoconversion device and having a second pinning potential, wherein said second pinning potential is different from said first pinning potential, said charge collection region comprising:
a first doped region of a second conductivity type for receiving charges from said photoconversion device, a second doped region of a first conductivity type within said first doped region and a third doped region of said second conductivity type within said first doped region and spaced from said second doped region, wherein said first doped region is configured to store a pixel charge to be read out as a pixel signal; and
a conductor connected to said third doped region for reading out stored charge from said first doped region.

36. The pixel sensor cell according to claim 35 wherein said charge collection region is a floating diffusion region.

37. The pixel sensor cell according to claim 35 further comprising a transfer transistor for transferring charge from said photoconversion device to said charge collection region.

38. The pixel sensor cell according to claim 35 wherein said photoconversion device is a pinned photodiode.

39. The pixel sensor cell according to claim 35 wherein said third doped region has a higher dopant concentration of said second conductivity type than said first doped region.

40. The pixel sensor cell according to claim 35 further comprising a storage capacitor connected to said conductor.

41. The pixel sensor cell according to claim 35 wherein said first doped region surrounds said third doped region.

* * * * *